(12) United States Patent
Boon et al.

(10) Patent No.: US 8,373,848 B2
(45) Date of Patent: Feb. 12, 2013

(54) LITHOGRAPHIC APPARATUS AND LORENTZ ACTUATOR

(75) Inventors: Fidelus Adrianus Boon, Bavel (NL); Hendrikus Pascal Gerardus Johannes Van Agtmaal, Best (NL)

(73) Assignee: ASML Netherlands B.V., Veldhoven (NL)

( * ) Notice: Subject to any disclaimer, the term of this patent is extended or adjusted under 35 U.S.C. 154(b) by 678 days.

(21) Appl. No.: 12/574,553

(22) Filed: Oct. 6, 2009

(65) Prior Publication Data
US 2010/0085552 A1    Apr. 8, 2010

Related U.S. Application Data

(60) Provisional application No. 61/103,412, filed on Oct. 7, 2008.

(51) Int. Cl.
*G03B 27/58*    (2006.01)
(52) U.S. Cl. .... 355/72; 355/53; 310/12.07; 310/154.28; 310/156.43
(58) Field of Classification Search .................. 355/53, 355/72; 310/12.07, 154.28, 156.43
See application file for complete search history.

(56) References Cited

U.S. PATENT DOCUMENTS

| | | |
|---|---|---|
| 4,758,750 A | 7/1988 | Itagaki et al. |
| 6,104,108 A | 8/2000 | Hazelton et al. |
| 7,145,269 B2 | 12/2006 | Hol et al. |
| 2003/0052548 A1 | 3/2003 | Hol et al. |
| 2005/0200208 A1 | 9/2005 | Johan Hol et al. |
| 2006/0082753 A1 | 4/2006 | Cox et al. |

FOREIGN PATENT DOCUMENTS

| | | |
|---|---|---|
| EP | 1286222 A1 | 2/2003 |
| JP | 2004-041715 | 2/2004 |
| JP | 2005-260234 | 9/2005 |

OTHER PUBLICATIONS

Japanese Office Action mailed Nov. 29, 2011 in corresponding Japanese Patent Application No. 2009-225782.
Q. Han et al., "Four- and eight-piece Halbach array analysis and geometry optimisation for Maglev," IEEE Proc.-Electr. Power Appl., vol. 152, No. 3, pp. 535-542 (May 2005).
Search Report and Written Opinion in related application Singapore Patent Application No. 200906587-1 dated Nov. 19, 2010.

*Primary Examiner* — Toan Ton
*Assistant Examiner* — Mesfin T Asfaw
(74) *Attorney, Agent, or Firm* — Pillsbury Winthrop Shaw Pittman LLP

(57) ABSTRACT

A lithographic apparatus includes an actuator for producing a force in a first direction between a first and a second part including a first magnet assembly and a second magnet assembly each attached opposite to each other to the first part of the apparatus, the first magnet assembly including a first main magnet system and a first subsidiary magnet system, and the second magnet assembly including a second main magnet system and a second subsidiary magnet system, the first and second main magnet system defining a space between them in a second direction perpendicular to the first direction. The actuator includes a coil attached to the second part. The distance between at least a part of the first subsidiary magnet system and at least a part of the second subsidiary magnet system is smaller than the minimum distance between the first main magnet system and the second main magnet system.

22 Claims, 6 Drawing Sheets

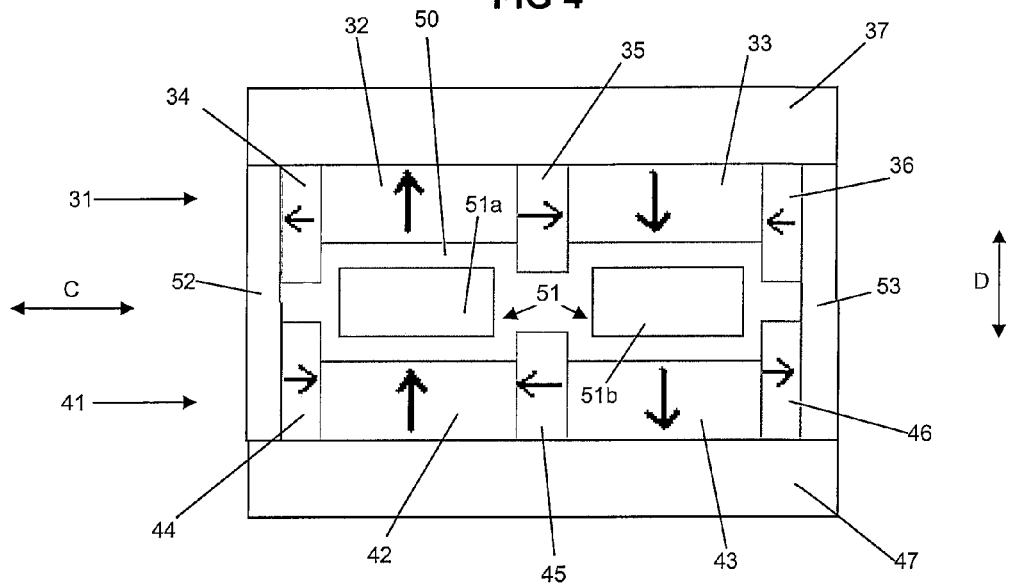
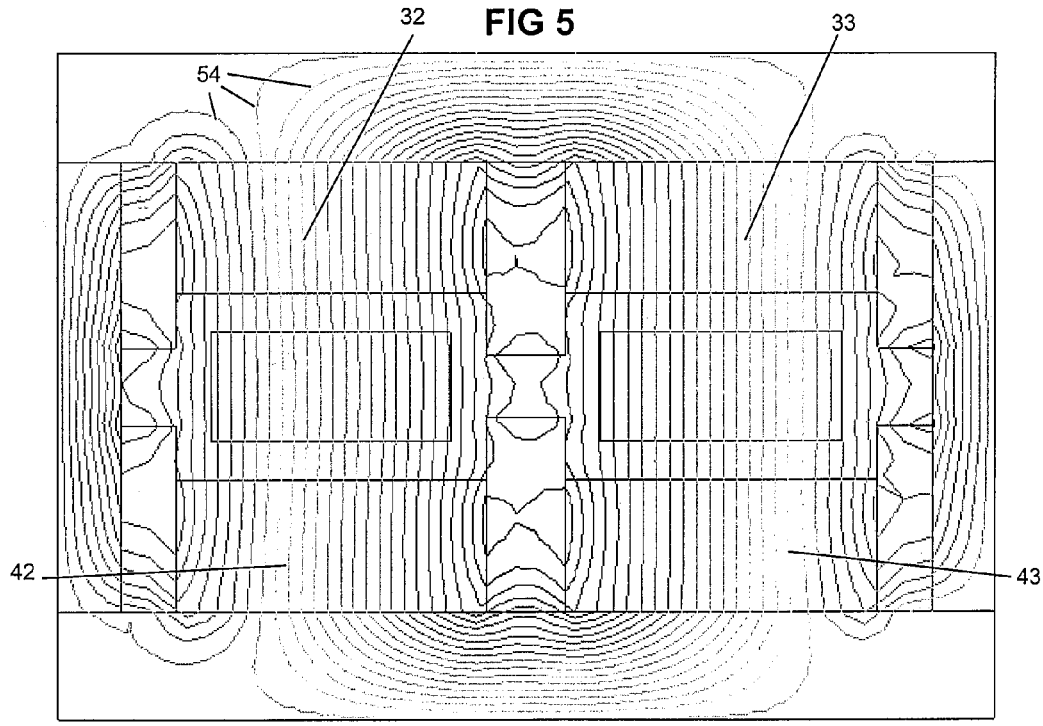

LITHOGRAPHIC APPARATUS AND LORENTZ ACTUATOR

CROSS REFERENCE TO RELATED APPLICATIONS

This application claims priority and benefit under 35 U.S.C. §119(e) to U.S. Provisional Patent Application No. 61/103,412, entitled "Lithographic Apparatus and Lorentz Actuator", filed on Oct. 7, 2008. The content of that application is incorporated herein in its entirety by reference.

FIELD

The present invention relates to a lithographic apparatus including a Lorentz actuator for providing a force between a first part and a second part of the apparatus, and a Lorentz actuator.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus of the type described above may employ a plurality of actuators to position a part of the lithographic apparatus. Examples of parts that may be positioned are the patterning device, the substrate, a part of an irradiation system, a part of an illumination system or any other part of the lithographic apparatus including a metrology frame of the apparatus which is commonly connected to the ground by means of low-frequency air mounts. The air mounts filter vibrations from the ground as much as possible and may include actuators to position the metrology frame with respect to the ground and for instance prevent the metrology frame from drifting.

An example of an actuator for use in lithographic apparatus is described in EP 1.286.222 and US patent publication 2005/0200208, the contents of which are incorporated herein by reference in its entirety. These documents describe a Lorentz actuator including a main magnet system providing a first magnetic field, a subsidiary magnet system providing a second magnetic field, and an electrically conductive element. The main magnet system and the subsidiary magnet system are arranged in Halbach configuration to combine the first and second magnetic field, wherein a magnetization direction of the magnets from the subsidiary magnet system is perpendicular to a magnetization direction of the magnets of the main magnet system. A force can be generated by the interaction between a current carried by the electrically conductive element and the magnetic field.

Motors in general can be characterized by a parameter known as "motor constant". The motor constant defines a relation between a motor input and a motor output, and in case of a Lorentz actuator the motor input is usually a current carried by the electrically conductive element and the motor output is usually a corresponding generated force due to the current. Most of the time, the motor constant is assumed to be a constant parameter, explaining the name motor constant. However, in practice, motors exhibit a motor position dependent motor constant, which can be divided into a constant average portion and a motor position dependent portion. Thus, when a person skilled in the art assumes a constant motor constant, he/she actually assumes the motor constant to be the constant average portion. The motor constant is motor position dependent due to for instance structural inaccuracies, tolerances, and/or deficiencies or inhomogeneous properties, such as material properties. One of the possible causes for the motor position dependency of the motor constant of a Lorentz actuator can be variations in magnetic field strength and/or magnetization direction/orientation of the magnets.

In this application the motor position is a relative position of different motor parts with respect to each other, e.g. a rotor with respect to a stator. In case of a Lorentz actuator as described above, the motor position is the relative position of the electrically conductive element to the main magnet system.

The motor position dependent portion of the motor constant introduces disturbances in the Lorentz actuator, which negatively influence the position accuracy between the first and second part of the apparatus. This can cause overlay errors and/or imaging problems in the lithographic apparatus.

SUMMARY

It is desirable to provide a lithographic apparatus with reduced overlay errors and/or imaging problems. It is further desirable to provide a Lorentz actuator with reduced variations in the motor constant.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a Lorentz actuator configured to produce a force in a first direction between a first and a second part of the apparatus, including a first magnet assembly and a second magnet assembly each attached opposite to each other to the first part of the apparatus, the first magnet assembly including a first main magnet system and a first subsidiary magnet system, and the second magnet assembly including a second main magnet system and a second subsidiary magnet system, the first and second main magnet system defining a space between them in a second direction substantially perpendicular to the first direction, wherein the first and second magnet assembly are arranged in Halbach configuration to provide a magnetic field of which at least a part is directed substantially in the second direction, the Lorentz actuator further including an electrically conductive element attached to the second part of the apparatus and arranged at least partially in the space between the first and second main magnet system, so as to produce the force by interaction of an electric current carried by the electrically conductive element and the magnetic field, wherein the distance between at least a part of the first subsidiary magnet system and at least a part of the second subsidiary magnet system is smaller than the minimum distance between the first main magnet system and the second main magnet system.

According to another embodiment of the, invention, there is provided a Lorentz actuator for producing a force in a first direction between a first and a second part, including a first magnet assembly and a second magnet assembly each attached opposite to each other to the first part, the first magnet assembly including a first main magnet system and a first subsidiary magnet system, and the second magnet assembly including a second main magnet system and a second subsidiary magnet system, the first and second main magnet system defining a space between them in a second direction substantially perpendicular to the first direction, wherein the first and second magnet assembly are arranged in Halbach configuration to provide a magnetic field of which at least a part is directed substantially in the second direction, the Lorentz actuator further including an electrically conductive element attached to the second part and arranged at least partially in the space between the first and second main magnet system, so as to produce the force by interaction of an electric current carried by the electrically conductive element and the magnetic field, wherein the distance between at least a part of the first subsidiary magnet system and at least a part of the second subsidiary magnet system is smaller than the minimum distance between the first main magnet system and the second main magnet system.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts a schematic view of a Lorentz actuator according to another embodiment of the invention;

FIG. 5 depicts a simulated flux plot of the Lorentz actuator according to FIG. 4;

DETAILED DESCRIPTION

Figure 1A:
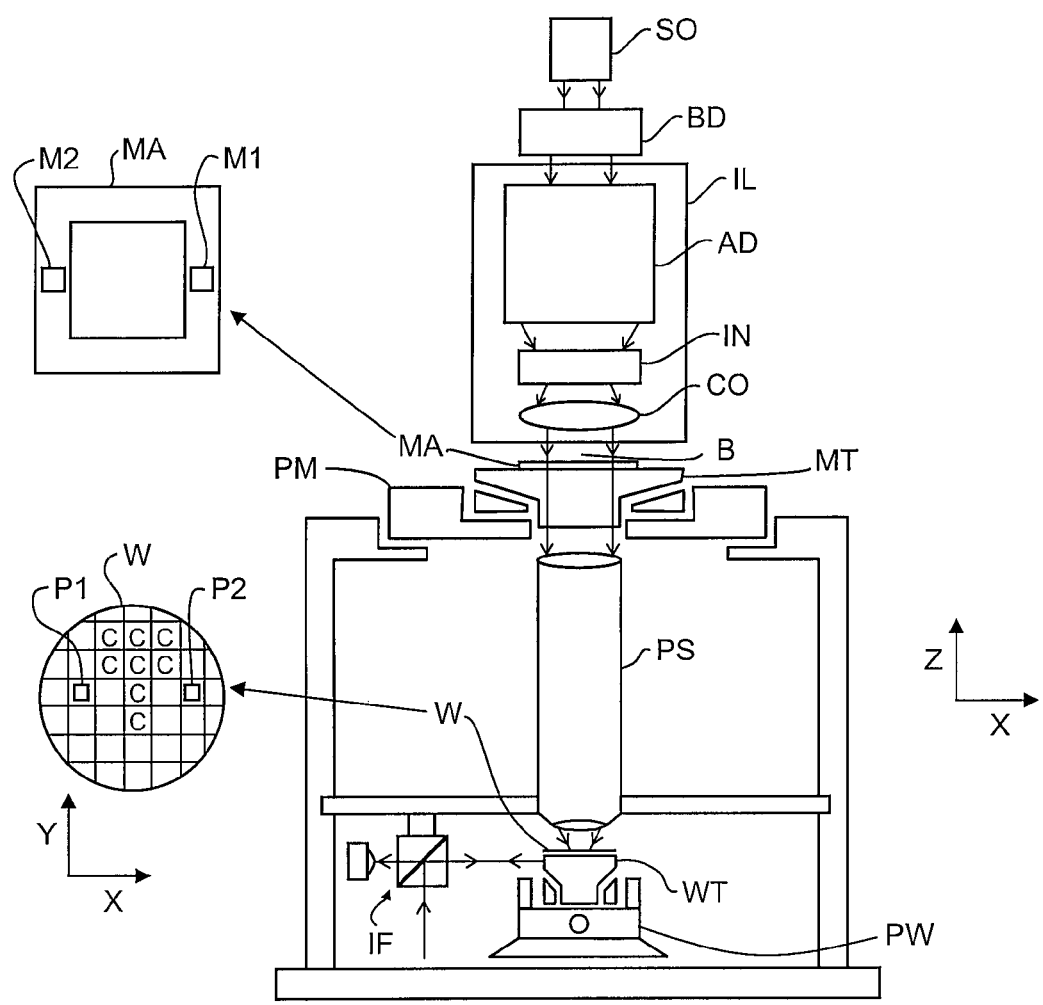
FIG. 1A depicts a lithographic apparatus according to an embodiment of the invention.

FIG. 1A schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more patterning device support or mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1A, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device support (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1A) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
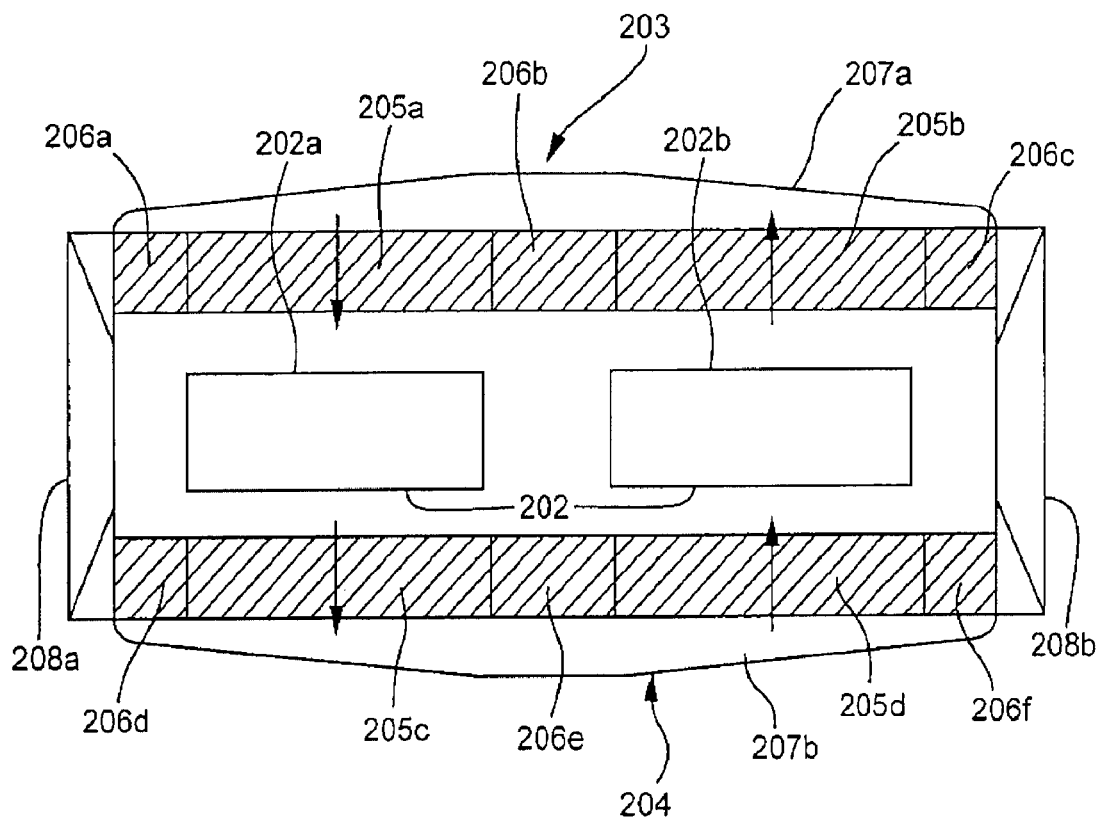
FIG. 1B depicts a schematic view of a conventional Lorentz actuator.

FIG. 1B depicts a schematic view of a prior art Lorentz actuator. The prior art Lorentz actuator includes a first magnet assembly 203 and a second magnet assembly 204. The first and second magnet assembly 203, 204 are attached to one part of for instance a lithographic apparatus. The first magnet assembly 203 includes a first main magnet system and a first subsidiary magnet system. The second magnet assembly 204 includes a second main magnet system and a second subsidiary magnet system.

The first main magnet system includes main magnets 205a, 205b, and the second main magnet system includes main magnets 205c, 205d. The polarity of the main magnets 205a, 205b, 205c, 205d is indicated by an arrow as drawn in the respective main magnet.

The first subsidiary magnet system includes subsidiary magnets 206a, 206b, and 206c. The second subsidiary magnet system includes subsidiary magnets 206d, 206e, and 206f. In this prior art Lorentz actuator, the main magnets 205a-205d and the subsidiary magnets 206a-206f are arranged in Halbach configuration.

The prior art Lorentz actuator is configured to generate a force having a direction as indicated by FIG. 1B from left to right or vice versa, in the plane of the drawing. The force acts between the main magnets 205a-205d and a electrically conductive element 202 attached to a second part of for instance a lithographic apparatus. In fact, the electrically conductive element 202 represents a cross sectional view of a coil, an electric current in one part of the coil 202a having an opposite direction than an electric current in the other part 202b of the coil. For this reason, polarity of the main magnets 205a, 205c is opposite to polarity of the main magnets 205b, 205d.

The prior art Lorentz actuator further includes a back iron 207a, 207b and magnetic flux guiding elements 208a, 208b, which extend between outer sides of the first magnet assembly 203 and the second magnet assembly 204.

Figure 1C:
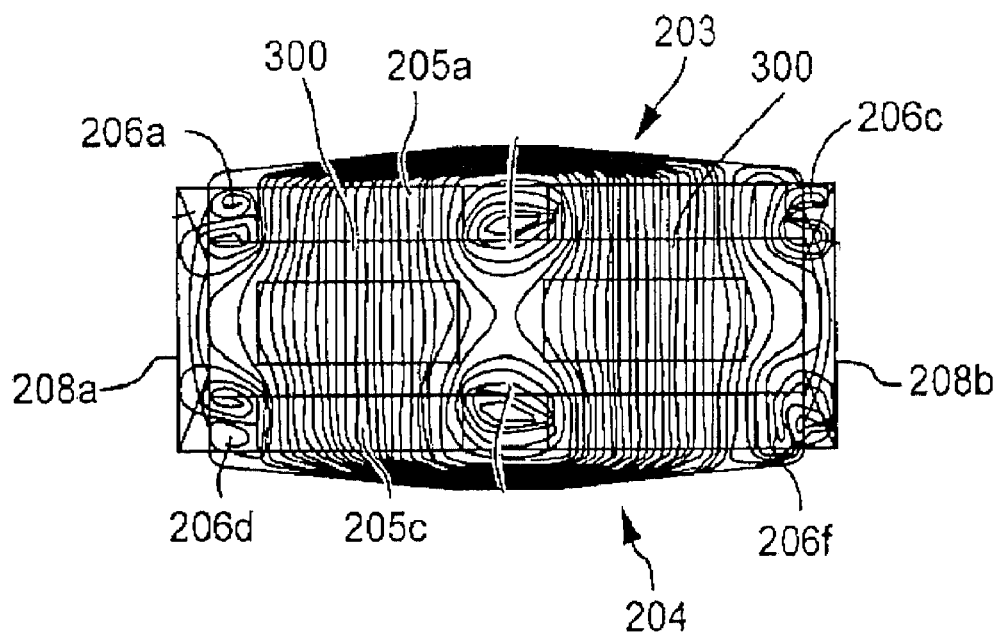
FIG. 1C depicts a simulated flux plot of the conventional Lorentz actuator according to FIG. 1B.

FIG. 1C depicts the prior art Lorentz actuator of FIG. 1B. Magnetic field lines are indicated by 300. The tangent of the lines 300 represents the direction of the magnetic field, and the distance between adjacent lines 300 represents the magnitude of the magnetic field. As can be seen from FIG. 1c, the magnetic field in the area of the parts 202a and 202b of the electrically conductive element 202 is not homogeneous. This results in variations of a motor constant of the prior art Lorentz actuator.

Figure 2:
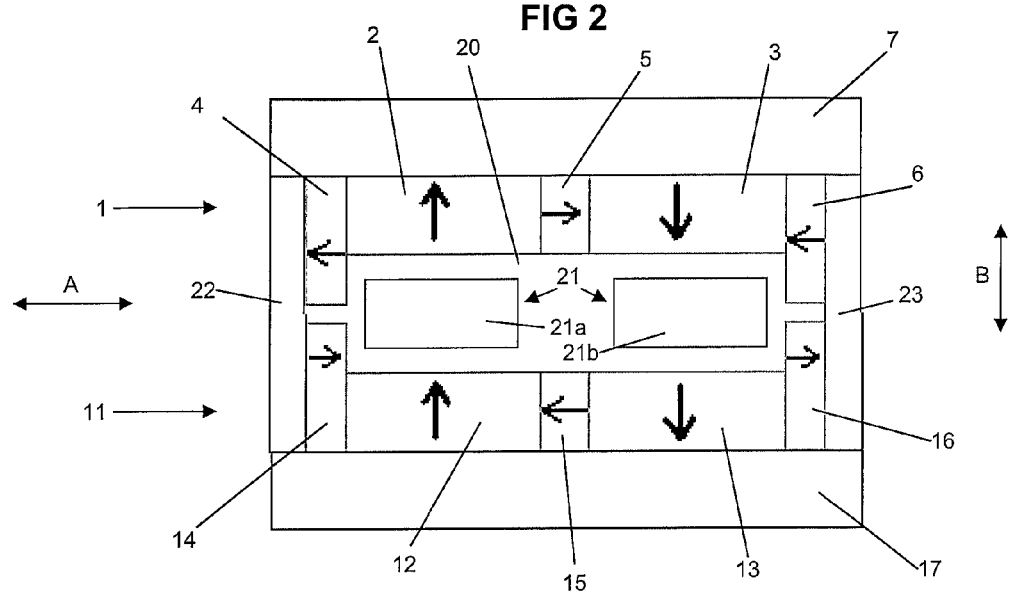
FIG. 2 depicts a schematic view of a Lorentz actuator according to an embodiment of the invention.

FIG. 2 depicts a schematic view of a Lorentz actuator according to an embodiment of the invention. The Lorentz actuator includes a first magnet assembly 1 and a second magnet assembly 11 attached opposite to each other to a first part (not shown). The first part may be a portion of a lithographic apparatus, for example the lithographic apparatus according to FIG. 1A.

The first magnet assembly 1 includes a first main magnet system, which includes in this embodiment two main magnets 2, 3. The first magnet assembly 1 further includes a first subsidiary magnet system, which includes in this embodiment three subsidiary magnets 4, 5, 6.

The second magnet assembly 11 includes a second main magnet system, which includes in this embodiment two main magnets 12, 13. The second magnet assembly further includes a second subsidiary magnet system, which includes in this embodiment three subsidiary magnets 14, 15, 16. A magnetic polarization of the main and subsidiary magnets is indicated by corresponding arrows drawn in the respective main and subsidiary magnets.

The first magnet assembly 1 and the second magnet assembly 11 together define a space 20 in between them in a direction indicated by arrow B. Inside the space 20 is located at least a part of an electrically conductive element 21, which is attached to a second part (not shown). The second part can be a portion of a lithographic apparatus. The electrically conductive element 21 includes two parts 21a and 21b, each able to carry an electric current (not shown). In fact, the electrically conductive element 21 represents a cross sectional view of a coil.

The main and subsidiary magnets of the first and second magnet assemblies 1, 11 are arranged in Halbach configuration to provide a magnetic field at least in space 20. At least a part of the magnetic field is directed substantially in the direction of arrow B. Preferably, the magnetic field between main magnet pair 2, 12 and between main magnet pair 3, 13 is directed substantially in the direction indicated by arrow B.

The polarity of the subsidiary magnets 4, 5, 6 is anti-parallel to the polarity of corresponding opposite subsidiary magnets 14, 15, 16 and substantially perpendicular to the polarity of the main magnets 2, 3, 12, 13. The polarity of the main magnets 2, 12 is opposite to the polarity of the main magnets 3, 13. The main magnets are further arranged to be at least partially located between two subsidiary magnets.

The first magnet assembly 1 further includes a back iron plate 7 attached to the main and subsidiary magnets of the first magnet assembly 1 in such a way that the main and subsidiary magnets of the first magnet assembly 1 are in between the back iron plate 7 and the electrically conductive element 21. Similarly, the second magnet assembly 11 includes a back iron plate 17 attached to the main and subsidiary magnets of the second magnet assembly 11 in such a way that the main and subsidiary magnets of the second magnet assembly 11 are in between the back iron plate 17 and the electrically conductive element 21. The back iron plates 7 and 17 have two benefits: they guide at least a portion of the magnetic field and shield the Lorentz actuator from external magnetic fields, i.e. magnetic fields originating from outside the actuator. The back iron plates 7, 17 also tend to keep the magnetic field inside the actuator thereby reducing the possibility of the magnetic field to influence systems outside the actuator. The back iron plates 7, 17 also increase the magnetic field inside the actuator relative to the situation without back iron.

The Lorentz actuator further includes a magnetic flux guiding element 22 and a magnetic flux guiding element 23. The magnetic flux guiding elements 22, 23 extend substantially between outer portions of the first and second magnetic assemblies. The magnetic flux guiding elements 22, 23 are configured to guide a portion of the magnetic field from one of the first and second magnet assemblies 1, 11 to the other one of the first and second magnet assemblies 1, 11. An additional benefit is that the magnetic flux guiding elements 22, 23 further shield the Lorentz actuator from external magnetic fields. The magnetic flux guiding elements 22, 23 also tend to keep the magnetic field inside the actuator thereby reducing the possibility of the magnetic field to influence systems outside the actuator. The magnetic flux guiding elements 22, 23 also increase the magnetic field inside the actuator relative to the situation without magnetic flux guiding elements 22, 23.

An electric current carried by electrically conductive element 21 will interact with the magnetic field between the main magnets 2 and 12, and between the main magnets 3 and 13 to produce a force in a direction indicated by arrow A. Preferably, the direction of an electric current in part 21a and part 21b is substantially perpendicular to the directions indicated by arrows A and B. Due to the mutually anti-parallel magnetic fields between main magnet pair 2, 12, and main magnet pair 3, 13, the electric currents in parts 21a and 21b are preferably also mutually anti-parallel. The direction of the electric current and the direction of the magnetic field determine if the force is directed to the left or the right in the plane of the drawing.

The distance between subsidiary magnets 4, 6, and respective subsidiary magnets 14, 16 in the direction indicated by arrow B is smaller than the distance between the main magnets 2, 3, and the respective main magnets 12, 13. This has the effect that the magnetic field between the main magnet pair 2, 12, and between main magnet pair 3, 13 is more homogeneous relative to for instance the situation wherein the distances are equal, as in FIGS. 1B and 1C. A more homogeneous magnetic field results in a more constant motor constant, thereby decreasing the variations of the motor position dependent motor constant and increasing the position accuracy between the first and second part.

An additional benefit is that the magnetic field between the main magnet pairs 2, 12 and 3, 13 is increased, thereby increasing a steepness of the Lorentz actuator. The steepness of the Lorentz actuator is defined as being $F^2/P$, wherein F is the generated force, and P is the dissipated power to generate this force. In other words, the increase in magnetic field increases the motor constant and thereby increases the generated force (motor output) for the same current (motor input). The increased motor constant also has the benefit that the design can be made smaller for generating the same force.

Figure 3:
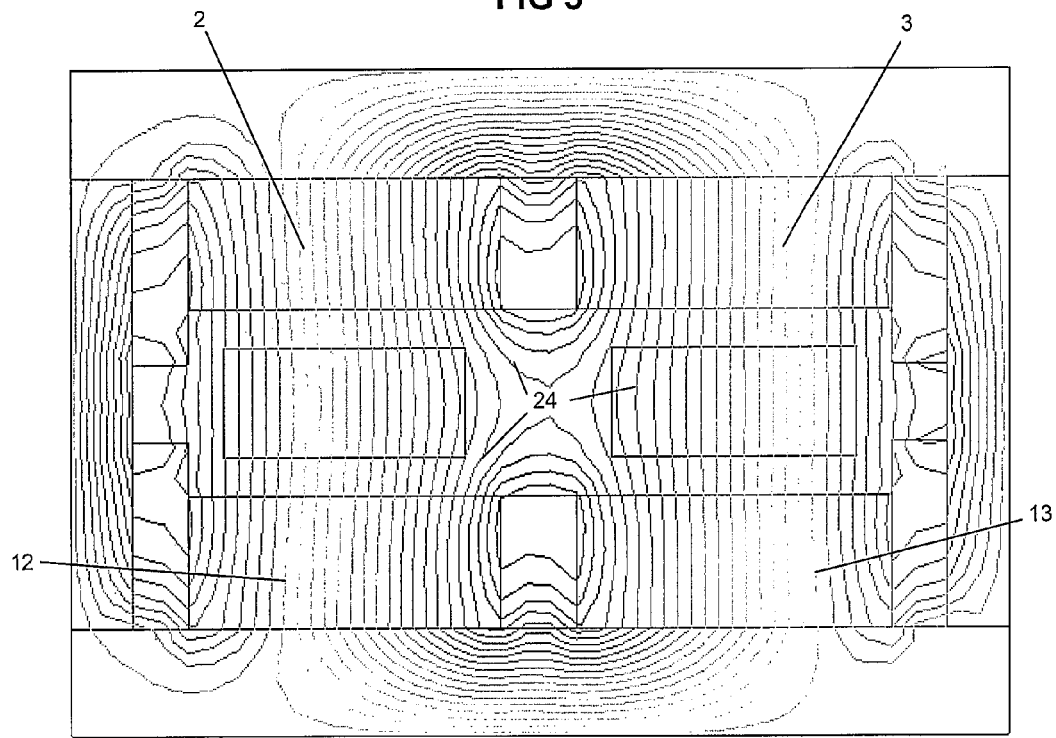
FIG. 3 depicts a simulated flux plot of the Lorentz actuator according to FIG. 2.

FIG. 3 depicts a simulated representation of the magnetic field in the Lorentz actuator of FIG. 2. FIG. 3 is made with a finite element modeling program and shows flux lines 24 that represent the magnetic field. It is noted that only a few flux lines 24 are indicated by reference numeral 24. The tangent of a flux line 24 represents the direction of the magnetic field, and the distance between adjacent flux lines 24 represents the magnitude of the magnetic field. A homogeneous magnetic field corresponds to a magnetic field having a substantially constant magnitude. As can be seen, the magnetic field between the main magnet pair 2, 12, and between the main magnet pair 3, 13 is substantially homogeneous. The design of this embodiment makes it especially suitable for applications requiring a relatively small positioning range and a relatively high positioning accuracy.

FIG. 4 depicts a schematic view of a Lorentz actuator according to another embodiment of the invention. The Lorentz actuator includes a first magnet assembly 31 and a second magnet assembly 41 attached opposite to each other to a first part (not shown). The first part may be a portion of a lithographic apparatus, for example the lithographic apparatus according to FIG. 1A.

The first magnet assembly 31 includes a first main magnet system, which includes in this embodiment two main magnets 32, 33. The first magnet assembly 31 further includes a first subsidiary magnet system, which includes in this embodiment three subsidiary magnets 34, 35, 36.

The second magnet assembly 41 includes a second main magnet system, which includes in this embodiment two main magnets 42, 43. The second magnet assembly further includes a second subsidiary magnet system, which includes in this embodiment three subsidiary magnets 44, 45, 46. A magnetic polarization of the main and subsidiary magnets is indicated by corresponding arrows drawn in the respective main and subsidiary magnets.

The first magnet assembly 31 and the second magnet assembly 41 together define a space 50 in between them in a direction indicated by arrow D. Inside the space 50 is located at least a part of an electrically conductive element 51, which is attached to a second part (not shown). The second part can be a portion of a lithographic apparatus. The electrically conductive element 51 includes two parts 51*a* and 51*b*, each able to carry an electric current (not shown). In fact, the electrically conductive element 51 represents a cross sectional view of a coil.

The main and subsidiary magnets of the first and second magnet assemblies are arranged in Halbach configuration to provide a magnetic field at least in space 50. At least a part of the magnetic field is directed substantially in the direction of arrow D. Preferably, the magnetic field between main magnet pair 32, 42 and between main magnet pair 33, 43 is directed substantially in the direction indicated by arrow D.

The polarity of the subsidiary magnets 34, 35, 36 is anti-parallel to the polarity of corresponding opposite subsidiary magnets 44, 45, 46 and substantially perpendicular to the polarity of the main magnets 32, 33, 42, 43. The polarity of the main magnets 32, 42 is opposite to the polarity of the main magnets 33, 43. The main magnets are further arranged to be at least partially located between two subsidiary magnets.

The first magnet assembly 31 further includes a back iron plate 37 attached to the main and subsidiary magnets of the first magnet assembly 31 in such a way that the main and subsidiary magnets of the first magnet assembly are in between the back iron plate 37 and the electrically conductive element 51. Similarly, the second magnet assembly 41 includes a back iron plate 47 attached to the main and subsidiary magnets of the second magnet assembly 41 in such a way that the main and subsidiary magnets of the second magnet assembly are in between the back iron plate 47 and the electrically conductive element 51. The back iron plates 37 and 47 have two benefits: they guide at least a portion of the magnetic field and shield the Lorentz actuator from external magnetic fields, i.e. magnetic fields originating from outside the actuator. The back iron plates 37, 47 also tend to keep the magnetic field inside the actuator thereby reducing the possibility of the magnetic field to influence systems outside the actuator. The back iron plates 37, 47 also increase the magnetic field inside the actuator relative to the situation without back iron.

The Lorentz actuator further includes a magnetic flux guiding element 52 and a magnetic flux guiding element 53. The magnetic flux guiding elements 52, 53 extend substantially between outer portions of the first and second magnetic assemblies. The magnetic flux guiding elements are configured to guide a portion of the magnetic field from one of the first and second magnet assemblies 31, 41 to the other one of the first and second magnet assemblies 31, 41. An additional benefit is that the magnetic flux guiding elements further shield the Lorentz actuator from external magnetic fields. The magnetic flux guiding elements 52, 53 also tend to keep the magnetic field inside the actuator thereby reducing the possibility of the magnetic field to influence systems outside the actuator. The magnetic flux guiding elements 52, 53 also increase the magnetic field inside the actuator relative to the situation without magnetic flux guiding elements 52, 53.

An electric current carried by electrically conductive element 51 will interact with the magnetic field between the main magnets 32 and 42, and between the main magnets 33 and 43 to produce a force in a direction indicated by arrow C. Preferably, the direction of an electric current in part 51*a* and part 51*b* is substantially perpendicular to the directions indicated by arrows C and D. Due to the mutually anti-parallel magnetic fields between main magnet pair 32, 42, and main magnet pair 33, 43, the electric currents in parts 51*a* and 51*b* are preferably also mutually anti-parallel. The direction of the electric current and the direction of the magnetic field determine if the force is directed to the left or the right in the plane of the drawing.

In this embodiment, the distances in the direction indicated by arrow D between the subsidiary magnets 34, 35, 36 and respective subsidiary magnets 44, 45, 46 are smaller than the distances between the main magnets 32, 33, and respective main magnets 42, 43. This has the benefit that the homogeneity of the magnetic fields between the main magnet pair 32, 42, and between main magnet pair 33, 43 is increased, thereby decreasing the variations in the motor constant and increasing the position accuracy between the first and second part.

An additional benefit is that the magnetic field between the main magnet pairs 32, 42 and 33, 43 is increased, thereby increasing the steepness of the Lorentz actuator. The increased motor constant also has the benefit that the design can be made smaller for generating the same force.

FIG. 5 depicts a simulated representation of the magnetic field in the Lorentz actuator of FIG. 4. FIG. 5 is made with a finite element modeling program and shows flux lines 54 that represent the magnetic field. It is noted that only a few flux lines 54 are indicated with reference numeral 54. The tangent of a flux line 54 represents the direction of the magnetic field and the distance between adjacent lines represent the magnitude of the magnetic field. As can be seen, the magnetic field between the main magnet pair 32, 42, and between the main magnet pair 33, 43 is substantially homogeneous. The design of this embodiment makes it especially suitable for applications requiring a relatively small positioning range and a relatively high positioning accuracy.

Figure 6:
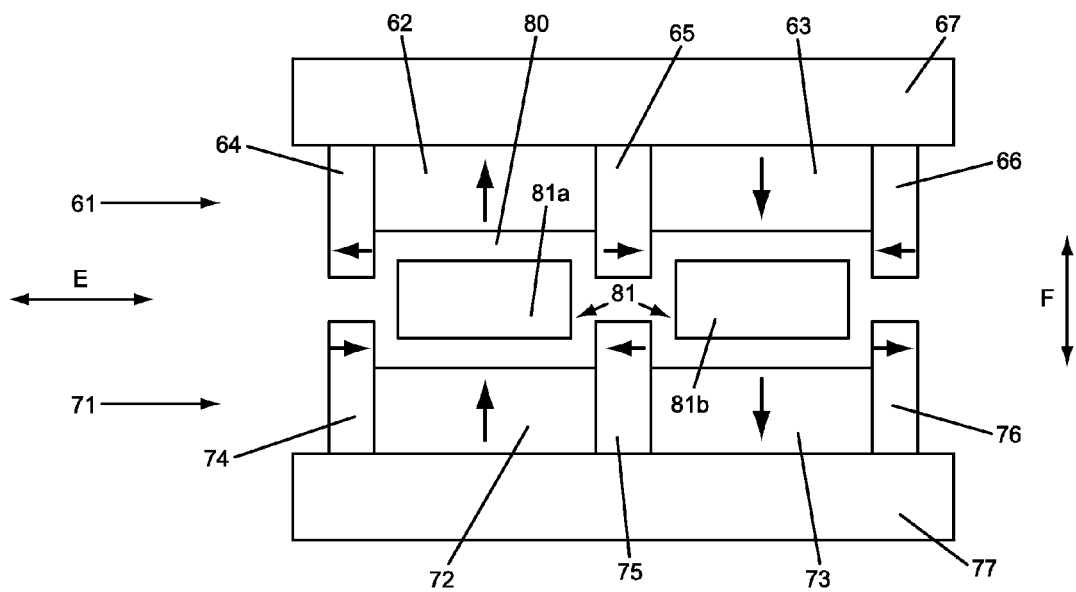
FIG. 6 depicts a schematic view of a Lorentz actuator according to yet another embodiment of the invention.

FIG. 6 depicts a schematic view of a Lorentz actuator according to yet another embodiment of the invention. The Lorentz actuator includes a first magnet assembly 61 and a second magnet assembly 71 attached opposite to each other to a first part (not shown). The first part may be a portion of a lithographic apparatus, for example the lithographic apparatus according to FIG. 1A.

The first magnet assembly 61 includes a first main magnet system, which includes in this embodiment two main magnets 62, 63. The first magnet assembly 61 further includes a first subsidiary magnet system, which includes in this embodiment three subsidiary magnets 64, 65, 66.

The second magnet assembly 71 includes a second main magnet system, which includes in this embodiment two main magnets 72, 73. The second magnet assembly further includes a second subsidiary magnet system, which includes in this embodiment three subsidiary magnets 74, 75, 76. A magnetic polarization of the main and subsidiary magnets is indicated by corresponding arrows drawn in the respective main and subsidiary magnets.

The first magnet assembly 61 and the second magnet assembly 71 together define a space 80 in between them in a direction indicated by arrow F. Inside the space 80 is located at least a part of an electrically conductive element 81, which is attached to a second part (not shown). The second part can be a portion of a lithographic apparatus. The electrically conductive element 81 includes two parts 81a and 81b, each able to carry an electric current (not shown). In fact, the electrically conductive element 81 represents a cross sectional view of a coil.

The main and subsidiary magnets of the first and second magnet assemblies are arranged in Halbach configuration to provide a magnetic field at least in space 80. At least a part of the magnetic field is directed substantially in the direction of arrow F. Preferably, the magnetic field between main magnet pair 62, 72 and between main magnet pair 63, 73 is directed substantially in the direction indicated by arrow F.

The polarity of the subsidiary magnets 64, 65, 66 is anti-parallel to the polarity of corresponding opposite subsidiary magnets 74, 75, 76 and substantially perpendicular to the polarity of the main magnets 62, 63, 72, 73. The polarity of the main magnets 62, 72 is opposite to the polarity of the main magnets 63, 73. The main magnets are further arranged to be at least partially located between two subsidiary magnets.

The first magnet assembly 61 further includes a back iron plate 67 attached to the main and subsidiary magnets of the first magnet assembly 61 in such a way that the main and subsidiary magnets of the first magnet assembly are in between the back iron plate 67 and the electrically conductive element 81. Similarly, the second magnet assembly 71 includes a back iron plate 77 attached to the main and subsidiary magnets of the second magnet assembly 71 in such a way that the main and subsidiary magnets of the second magnet assembly are in between the back iron plate 77 and the electrically conductive element 81. The back iron plates 67 and 77 have two benefits: they guide at least a portion of the magnetic field and shield the Lorentz actuator from external magnetic fields, i.e. magnetic fields originating from outside the actuator. The back iron plates 67, 77 also tend to keep the magnetic field inside the actuator thereby reducing the possibility of the magnetic field to influence systems outside the actuator. The back iron plates 67, 77 also increase the magnetic field inside the actuator relative to the situation without back iron.

An electric current carried by electrically conductive element 81 will interact with the magnetic field between the main magnets 62 and 72, and between the main magnets 63 and 73 to produce a force in a direction indicated by arrow E. Preferably, the direction of an electric current in part 81a and part 81b is substantially perpendicular to the directions indicated by arrows E and F. Due to the mutually anti-parallel magnetic fields between main magnet pair. 62, 72, and main magnet pair 63, 73, the electric currents in parts 81a and 81b are preferably also mutually anti-parallel. The direction of the electric current and the direction of the magnetic field determine if the force is directed to the left or the right in the plane of the drawing.

In this embodiment, the distances in the direction indicated by arrow F between the subsidiary magnets 64, 65, 66 and respective subsidiary magnets 74, 75, 76 are smaller than the distance between the main magnet pairs 62, 72 and 63, 73. This has the benefit that the homogeneity of the magnetic fields between the main magnet pair 62, 72, and between the main magnet pair 63, 73 is increased, thereby decreasing the variations in the motor constant and increasing the position accuracy between the first and second part.

An additional benefit is that the magnetic field between the main magnet pairs 62, 72 and 63, 73 is increased, thereby increasing the steepness of the Lorentz actuator. The increased motor constant also has the benefit that the design can be made smaller for generating the same force.

Figure 7:
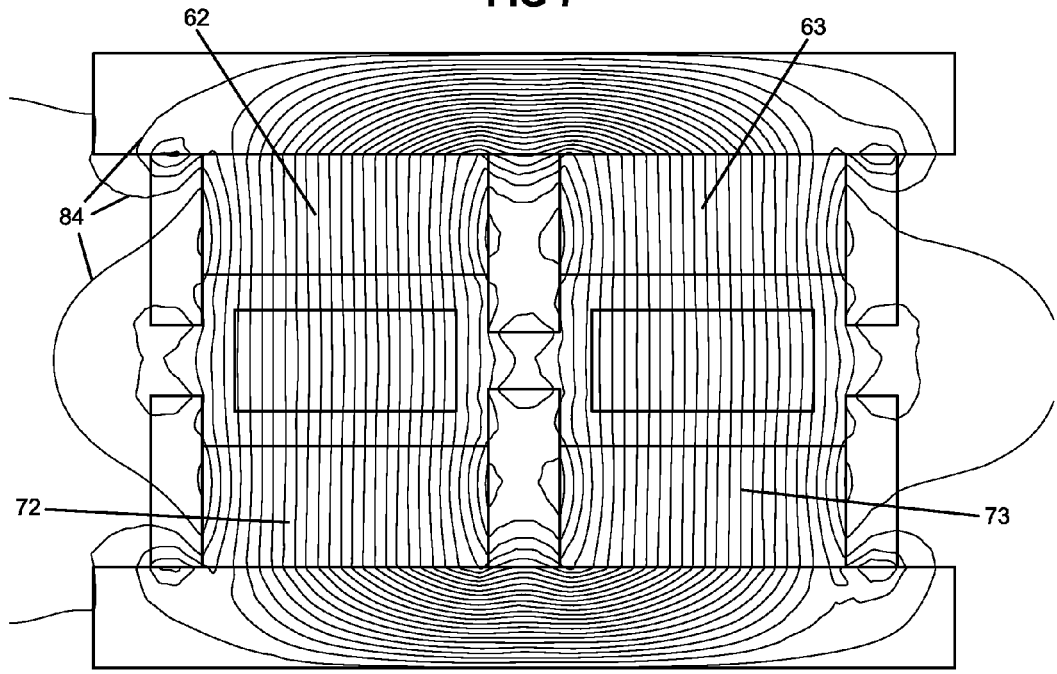
FIG. 7 depicts a simulated flux plot of the Lorentz actuator according to FIG. 6.

FIG. 7 depicts a simulated representation of the magnetic field in the Lorentz actuator of FIG. 6. FIG. 7 is made with a finite element modeling program and shows flux lines 84 that represent the magnetic field. It is noted that only a few flux lines are indicated with reference numeral 84. The tangent of a flux line 84 represents the direction of the magnetic field and the distance between adjacent flux lines 84 represent the magnitude of the magnetic field. A homogeneous magnetic field corresponds to a substantially constant magnitude. As can be seen, the magnetic field between the main magnets 62 and 72, and between the main magnets 63 and 73 is substantially homogeneous in the area between main magnets 62, 72 and 63, 73. The design of this embodiment makes it especially suitable for applications requiring a relatively small positioning range and a relatively high positioning accuracy.

Figure 8:
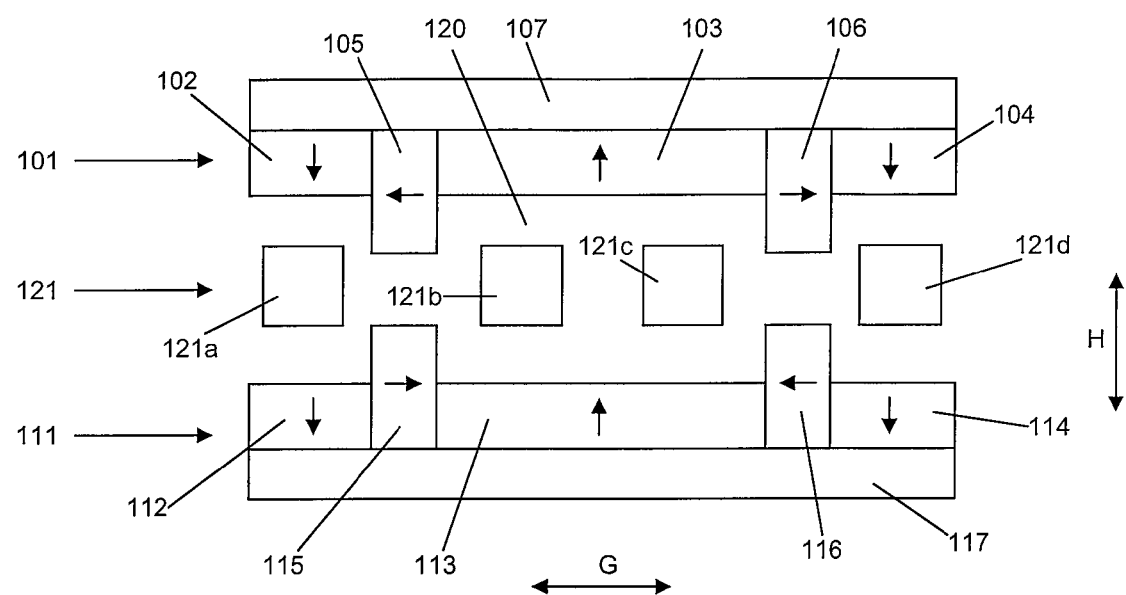
FIG. 8 depicts a schematic view of a Lorentz actuator according to another embodiment of the invention.

FIG. 8 depicts a schematic view of a Lorentz actuator according to another embodiment of the invention. The Lorentz actuator includes a first magnet assembly 101 and a second magnet assembly 111 attached opposite to each other to a first part (not shown). The first part may be a portion of a lithographic apparatus, for example the lithographic apparatus according to FIG. 1A.

The first magnet assembly 101 includes a first main magnet system, which includes in this embodiment three main magnets 102, 103, and 1.04. The first magnet assembly 101 further includes a first subsidiary magnet system, which includes in this embodiment two subsidiary magnets 105, 106.

The second magnet assembly 111 includes a second main magnet system, which includes in this embodiment three main magnets 112, 113, and 114. The second magnet assembly further includes a second subsidiary magnet system, which includes in this embodiment two subsidiary magnets 115, 116. A magnetic polarization of the main and subsidiary magnets is indicated by corresponding arrows drawn in the respective main and subsidiary magnets.

The first magnet assembly 101 and the second magnet assembly 111 together define a space 120 in between them in a direction indicated by arrow H. Inside the space 120 is located at least a part of an electrically conductive element 121, which is attached to a second part (not shown). The second part can be a portion of a lithographic apparatus. The electrically conductive element 121 includes in this embodiment four parts 121a, 121b, 121c, and 121d each able to carry an electric current (not shown).

The main and subsidiary magnets of the first and second magnet assemblies are arranged in Halbach configuration to provide a magnetic field at least in space 120. At least a part of the magnetic field is directed substantially in the direction of arrow H. Preferably, the magnetic field between main magnet pair 102, 112, between main magnet pair 103, 113 and between main magnet pair 104, 114 is directed substantially in the direction indicated by arrow H.

The polarity of the subsidiary magnets 105, 106 is anti-parallel to the polarity of corresponding opposite subsidiary magnets 115, 116 and substantially perpendicular to the polarity of the main magnets 102, 103, 104, 112, 113, 114. The polarity of the main magnets 102, 104, 112, 114 is opposite to the polarity of the main magnets 103, 113. The subsidiary magnets are further arranged to be at least partially located between two main magnets.

The first magnet assembly 101 further includes a back iron plate 107 attached to the main and subsidiary magnets of the first magnet assembly 101 in such a way that the main and subsidiary magnets of the first magnet assembly are in between the back iron plate 107 and the electrically conductive element 121. Similarly, the second magnet assembly 111 includes a back iron plate 117 attached to the main and subsidiary magnets of the second magnet assembly 111 in such a way that the main and subsidiary magnets of the second magnet assembly are in between the back iron plate 117 and the electrically conductive element 121. The back iron plates 107 and 117 have two benefits: they guide at least a portion of the magnetic field and shield the Lorentz actuator from external magnetic fields, i.e. magnetic fields originating from outside the actuator. The back iron plates 107, 117 also tend to keep the magnetic field inside the actuator thereby reducing the possibility of the magnetic field to influence systems outside the actuator. The back iron plates 107, 117 also increase the magnetic field inside the actuator relative to the situation without back iron.

An electric current carried by electrically conductive element 121 will interact with the magnetic field between the main magnets 102 and 112, between the main magnets 103 and 113, and between the main magnets 104 and 114 to produce a force in a direction indicated by arrow G. Preferably, the direction of an electric current in parts 121a, 121b, 121c, 121d is substantially perpendicular to the directions indicated by arrows A and B. Due to the mutually anti-parallel magnetic fields between main magnet pairs 102, 112 and 104, 114, and main magnet pair 103, 113, the electric currents in parts 121a and 121d are preferably mutually anti-parallel to the electric currents in parts 121b, 121c. The direction of the electric current and the direction of the magnetic field determine if the force is directed to the left or the right in the plane of the drawing.

The distance between subsidiary magnets 105, 106 and respective subsidiary magnets 115 and 116 in the direction indicated by arrow H is smaller than the distance between the main magnet pairs 102, 112 and 103, 113, and 104, 114. This has the effect that the magnetic field between the main magnet pair 102, 112, main magnet pair 103, 113, and main magnet pair 104, 114 is more homogeneous relative to for instance the situation wherein the distances are equal, as shown in FIGS. 1B and 1C. A more homogeneous magnetic field results in a more constant motor constant, thereby decreasing the variations of the motor position dependent motor constant and increasing the position accuracy between the first and second part.

An additional benefit is that the magnetic field between the main magnet pairs 102, 112 and 103, 113, and 104, 114 is increased, thereby increasing the steepness of the Lorentz actuator. The increased motor constant also has the benefit that the design can be made smaller for generating the same force.

The embodiment of FIG. 8 has the additional benefit that it can be extended in longitudinal direction, thereby allowing for instance the use of a three-phase actuator.

The above described embodiments of a Lorentz actuator have the potential to achieve a variation in the motor constant of less than 0.1% of the average motor constant due to the inhomogenity of the magnetic field only over a positioning range of several millimeters.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV)

radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   an actuator configured to produce a force in a first direction between a first and a second part of the apparatus, the actuator comprising
      a first magnet assembly and a second magnet assembly each attached opposite to each other to the first part of the apparatus, the first magnet assembly comprising a first main magnet system and a first subsidiary magnet system, and the second magnet assembly comprising a second main magnet system and a second subsidiary magnet system, the first and second main magnet system defining a space between them in a second direction substantially perpendicular to the first direction, wherein the first and second magnet assembly are arranged in Halbach configuration to provide a magnetic field of which at least a part is directed substantially in the second direction,
      an electrically conductive element attached to the second part of the apparatus and arranged at least partially in the space between the first and second main magnet system, so as to produce the force by interaction of an electric current carried by the electrically conductive element and the magnetic field,
   wherein the distance between at least a part of the first subsidiary magnet system and at least a part of the second subsidiary magnet system is smaller than a minimum distance between the first main magnet system and the second main magnet system.

2. The lithographic apparatus according to claim 1, wherein the first magnet assembly comprises two subsidiary magnets of the first subsidiary magnet system and a main magnet of the first main magnet system, the main magnet of the first main magnet system being located at least partially between the two subsidiary magnets of the first subsidiary magnet system, and wherein the second magnet assembly comprises two subsidiary magnets of the second subsidiary magnet system and a main magnet of the second main magnet system, the main magnet of the second main magnet system being located at least partially between the two subsidiary magnets of the second subsidiary magnet system, wherein the magnetic polarizations of the subsidiary magnets are oriented substantially mutually antiparallel and substantially perpendicular to the magnetic polarization of the main magnets.

3. The lithographic apparatus according to claim 1, wherein the part of the electrically conductive element that is arranged in the space between the first and second main magnet systems is oriented such that the direction of the electric current carried by it is substantially perpendicular to the first and second directions.

4. The lithographic apparatus according to claim 1, wherein the first and second main magnet systems each comprise at least one magnet that is oriented such that its magnetic polarization is substantially perpendicular to the first direction and substantially parallel to the second direction.

5. The lithographic apparatus according to claim 1, wherein the first and second main magnet systems each comprise a first and second main magnets oriented such that their magnetic polarizations are mutually anti-parallel.

6. The lithographic apparatus according to claim 1, wherein at least one of the first and second magnet assemblies comprises a back iron, located such that the at least one of the first and second magnet assemblies is located between the back iron and the electrically conductive element.

7. The lithographic apparatus according to claim 1, wherein the actuator further comprises a magnetic flux guiding element extending substantially between outer portions of the first and second magnet assembly, the magnetic flux guiding element configured to guide a portion of the second magnetic field from one of the first and second magnet assemblies to the other one of the first and second magnet assemblies.

8. The lithographic apparatus according to claim 1, wherein the distance between at least a part of the first subsidiary magnet system and at least a part of the second subsidiary magnet system is at least half the distance between the first main magnet system and the second main magnet system.

9. The lithographic apparatus according to claim 1, wherein the distance between at least a part of the first subsidiary magnet system and at least a part of the second subsidiary magnet system is at least ⅓ the distance between the first main magnet system and the second main magnet system.

10. The lithographic apparatus according to claim 1, wherein the actuator is substantially symmetrical with respect to a plane extending in the first direction and a third direction being substantially perpendicular to the first and second direction.

11. An actuator for producing a force in a first direction between a first and a second part, the actuator comprising:
   a first magnet assembly and a second magnet assembly each attached opposite to each other to the first part, the first magnet assembly comprising a first main magnet system and a first subsidiary magnet system, and the second magnet assembly comprising a second main magnet system and a second subsidiary magnet system, the first and second main magnet system defining a space between them in a second direction substantially perpendicular to the first direction, wherein the first and second magnet assembly are arranged in Halbach configuration to provide a magnetic field of which at least a part is directed substantially in the second direction; and
   an electrically conductive element attached to the second part and arranged at least partially in the space between the first and second main magnet system, so as to produce the force by interaction of an electric current carried by the electrically conductive element and the magnetic field, wherein the distance between at least a part of the first subsidiary magnet system and at least a part of the second subsidiary magnet system is smaller than the minimum distance between the first main magnet system and the second main magnet system.

12. The actuator according to claim 11, wherein the first magnet assembly comprises two subsidiary magnets of the first subsidiary magnet system and a main magnet of the first main magnet system, the main magnet of the first main magnet system being located at least partially between the two subsidiary magnets of the first subsidiary magnet system, and wherein the second magnet assembly comprises two subsidiary magnets of the second subsidiary magnet system and a main magnet of the second main magnet system, the main magnet of the second main magnet system being located at least partially between the two subsidiary magnets of the second subsidiary magnet system, wherein the magnetic polarizations of the subsidiary magnets are oriented substantially mutually anti-parallel and substantially perpendicular to the magnetic polarization of the main magnets.

13. The actuator according to claim 11, wherein the part of the electrically conductive element that is arranged in the space between the first and second main magnet systems is oriented such that the direction of the electric current carried by it is substantially perpendicular to the first and second direction.

14. The actuator according to claim 11, wherein the first and second main magnet systems each comprise at least one magnet that is oriented such that its magnetic polarization is substantially perpendicular to the first direction and substantially parallel to the second direction.

15. The actuator according to claim 11, wherein the first and second main magnet systems each comprise a first and second main magnet oriented such that their magnetic polarizations are mutually anti-parallel.

16. The actuator according to claim 11, wherein at least one of the first and second magnet assemblies comprises a back iron, located such that the at least one of the first and second magnet assembly is located between the back iron and the electrically conductive element.

17. The actuator according to claim 11, wherein the actuator further comprises a magnetic flux guiding element extending substantially between outer portions of the first and second magnet assembly, the magnetic flux guiding element configured to guide a portion of the second magnetic field from one of the first and second magnet assemblies to the other one of the first and second magnet assemblies.

18. The actuator according to claim 11, wherein the distance between at least a part of the first subsidiary magnet system and at least a part of the second subsidiary magnet system is at least half the distance between the first main magnet system and the second main magnet system.

19. The actuator according to claim 11, wherein the distance between at least a part of the first subsidiary magnet system and at least a part of the second subsidiary magnet system is at least ⅓ the distance between the first main magnet system and the second main magnet system.

20. The actuator according to claim 11, wherein the actuator is substantially symmetrical with respect to a plane extending in the first direction and a third direction being substantially perpendicular to the first and second direction.

21. The lithographic apparatus according to claim 1, wherein a direction of magnetic polarization of said at least part of the first subsidiary magnet system and a direction of magnetic polarization of said at least part of the second subsidiary magnet system are substantially perpendicular to said second direction.

22. The actuator according to claim 11, wherein a direction of magnetic polarization of said at least part of the first subsidiary magnet system and a direction of magnetic polarization of said at least part of the second subsidiary magnet system are substantially perpendicular to said second direction.

\* \* \* \* \*